United States Patent [19]
Black et al.

[11] Patent Number: 5,430,416
[45] Date of Patent: Jul. 4, 1995

[54] POWER AMPLIFIER HAVING NESTED AMPLITUDE MODULATION CONTROLLER AND PHASE MODULATION CONTROLLER

[75] Inventors: Gregory R. Black, Vernon Hills; Alexander W. Hietala, Cary, both of Ill.

[73] Assignee: Motorola, Schaumburg, Ill.

[21] Appl. No.: 201,284

[22] Filed: Feb. 23, 1994

[51] Int. Cl.⁶ ............... H03C 1/00; H03C 3/00
[52] U.S. Cl. .................. 332/145; 332/151; 455/63; 455/102; 455/126
[58] Field of Search .......... 332/145, 151, 152; 455/63, 102, 126

[56] References Cited

U.S. PATENT DOCUMENTS

| | | |
|---|---|---|
| 4,972,440 | 11/1990 | Ernst et al. ............... 332/145 X |
| 5,091,919 | 2/1992 | Kuisma ............... 375/60 |
| 5,121,077 | 6/1992 | McGann ............... 330/149 |
| 5,124,665 | 6/1992 | McGann ............... 330/149 |
| 5,144,258 | 9/1992 | Nakanishi et al. ............... 330/129 |

*Primary Examiner*—Siegfried H. Grimm
*Attorney, Agent, or Firm*—Kirk W. Dailey

[57] ABSTRACT

Transmitting signals containing amplitude modulated (AM) and phase modulation (PM) components requires a transmitter having AM and PM control loops. The PM control loop provides phase modulation, frequency translation and phase predistortion for the transmitter. The phase predistortion/correction is accomplished by using an oscillator, thus, the amount of PA phase correction is essentially unlimited. Additionally, the PM control loop is nested about a power amplifier (PA), allowing the PM control loop to correct for any distortion introduced by the PA.

24 Claims, 4 Drawing Sheets

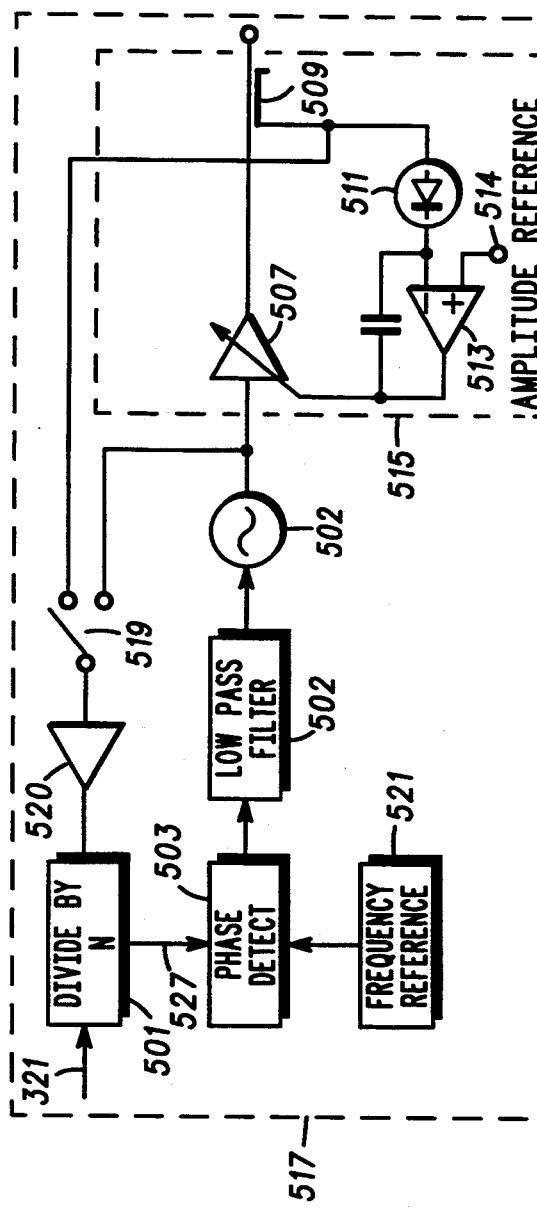
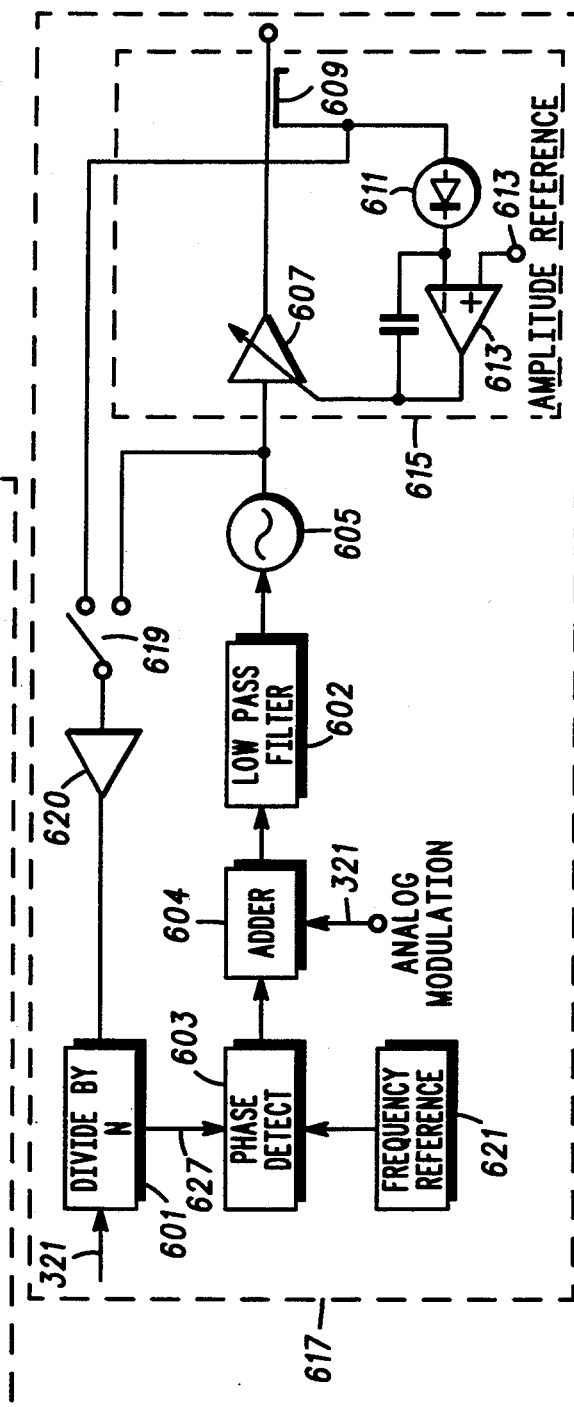

POWER AMPLIFIER HAVING NESTED AMPLITUDE MODULATION CONTROLLER AND PHASE MODULATION CONTROLLER

FIELD OF THE INVENTION

Generally, this invention relates to linear transmitters and, more specifically, to nesting an amplitude modulation (AM) control loop and a phase modulation (PM) control loop around a power amplifier (PA) module in a radio frequency transmitter.

BACKGROUND OF THE INVENTION

Typically, radio frequency (RF) transmitters, such as those used in radiotelephones, employ standard phase modulation (PM) techniques. PM transmitters employ power amplifiers (PAs) that are highly efficient and have large amplitude nonlinearity because there is no amplitude modulation (AM) component in the modulation format. These PAs often employ transistor bias techniques whereby the bias current is minimized and the output power is controlled by changing the bias current.

Recently, there has been a need to have a transmitter for transmitting signals having AM components and PM components. An AM/PM transmitter requires modulation circuitry for amplitude and phase. Typically, the modulation circuitry is accomplished with control loop circuit configurations. FIG. 1 is a detailed block diagram of a prior art AM/PM transmitter having an AM 115 control loop and a PM 117 control loop. In addition to the phase modulation, the PM control loop 117 performs a frequency translation of a phase reference signal 121 to the desired output frequency. The PM control loop 117 includes a mixer 101, a phase detector 103, and a voltage controlled oscillator (VCO) 105. The mixer generates an intermediate frequency signal 127 having a frequency which is equal to the difference between the frequency of a frequency reference input signal 123 and the frequency of the signal which is fed back from the VCO 105. The phase comparator 103 generates an error signal based on the difference in phase of an intermediate frequency signal 127 and a phase reference input signal 121. The phase comparator output drives a tuning port of the VCO such that the VCO output signal has a phase which is approximately equal to the phase of the phase reference input signal 121, thus providing the phase modulation of the VCO output signal. To perform the frequency translation, the phase comparator output drives the VCO tuning port such that the VCO output signal has a frequency which is equal to the frequency of the local oscillator input signal plus the frequency of the phase reference signal.

The AM control loop is integrated about a power amplifier (PA) 107 having an output amplitude control port. The AM control loop 115 includes the PA 107, an output power coupler 109, an envelope detector 111 and a difference amplifier 113. A portion of the PA output signal is fed back to the envelope detector 111 via the coupler 109. The difference amplifier 113 generates an error signal based on the difference in voltage of the envelope detector 111 output and the amplitude reference input signal 125. The difference amplifier 113 drives the PA output amplitude control port such that the amplitude of the PA output is responsive to the voltage of the amplitude reference input signal 125, thereby achieving amplitude modulation of the power amplifier output signal.

A problem arises when the AM control signal going to the PA control port causes a phase shift on the PA output signal, referred to as an AM to PM conversion effect. This AM to PM conversion effect is a result of a nonlinearity of the PA that is characteristic of PA's which employ design techniques used to minimize bias current and maximize power efficiency, and when the output power is controlled by varying the bias current.

In the past, several approaches have been used to eliminate this AM to PM conversion effect. First, by using a more linear PA module, AM to PM effects were reduced. However, a linear PA is inefficient and power-consuming, and is not desirable for applications such as portable radio telephones. Second, the phase of the reference signal was adjusted such that the PA input signal phase is predistorted thereby canceling the phase distortion which occurs in the PA. However, the required degree of predistortion is dependent on output signal level, supply voltage, and temperature resulting in a very complex open loop control scheme. Third, the PA was embedded within a predistortion loop which shifted the phase of the PA input signal such that the total phase shift through the predistortion loop was automatically forced to zero.

FIG. 2 is a simplified block diagram of a PA embedded in a predistortion loop. In the circuit, the input signal passes through an input coupler 201 and a phase shifter 203 before going into the PA 205. The PA output signal passes through an output coupler 207. The input coupler 201 and output coupler 207 feed portions of the input signal and the PA output signal to the phase comparator 209. The phase comparator generates an error signal based on the difference in phase between the input signal and the PA output signal. The phase comparator 209 output drives the control port of the phase shifter 203 such that the PA input is automatically predistorted and the PA output signal has a phase which is approximately equal to the input signal. The predistortion loop thereby eliminates the phase distortion in the PA. However, the predistortion loop circuitry adds unwanted cost and complexity. Furthermore, a problem arises when the phase shift of the PA exceeds the finite range of the phase shifter.

Thus, it would be desirable to develop an AM/PM transmitter capable of frequency modulation, frequency translation and amplitude modulation, wherein there are no restrictions on the phase distortion which occurs in the PA, nor dependency upon the output signal level, the supply voltage, or the temperature.

BRIEF DESCRIPTION OF THE DRAWINGS

FIG. 5 is a detailed illustration in block diagram form of a transmitter in accordance with the present invention.

FIG. 6 is a detailed illustration in block diagram form of an alternate realization of a transmitter in accordance with the present invention.

Detailed Description of a Preferred Embodiment

Figure 1:
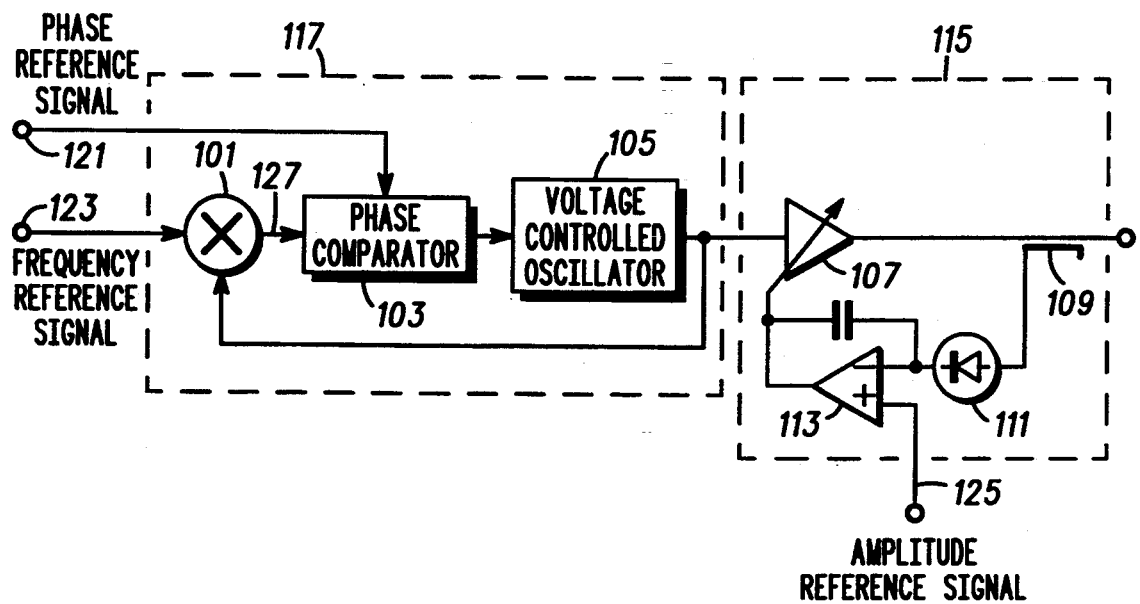
FIG. 1 is a detailed illustration of a transmitter that is prior art.
Figure 2:
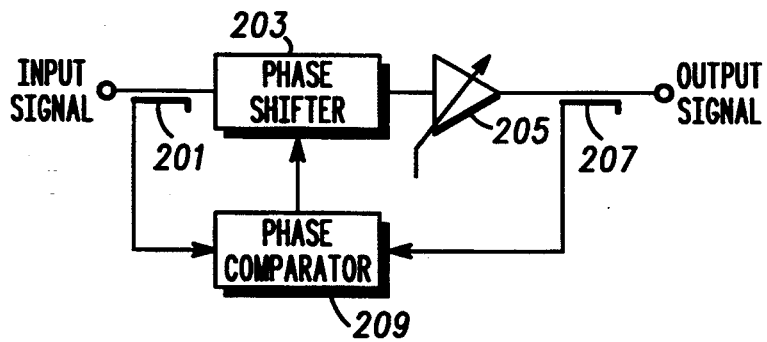
FIG. 2 is a detailed illustration of a power amplifier which is prior art.
Figure 3:
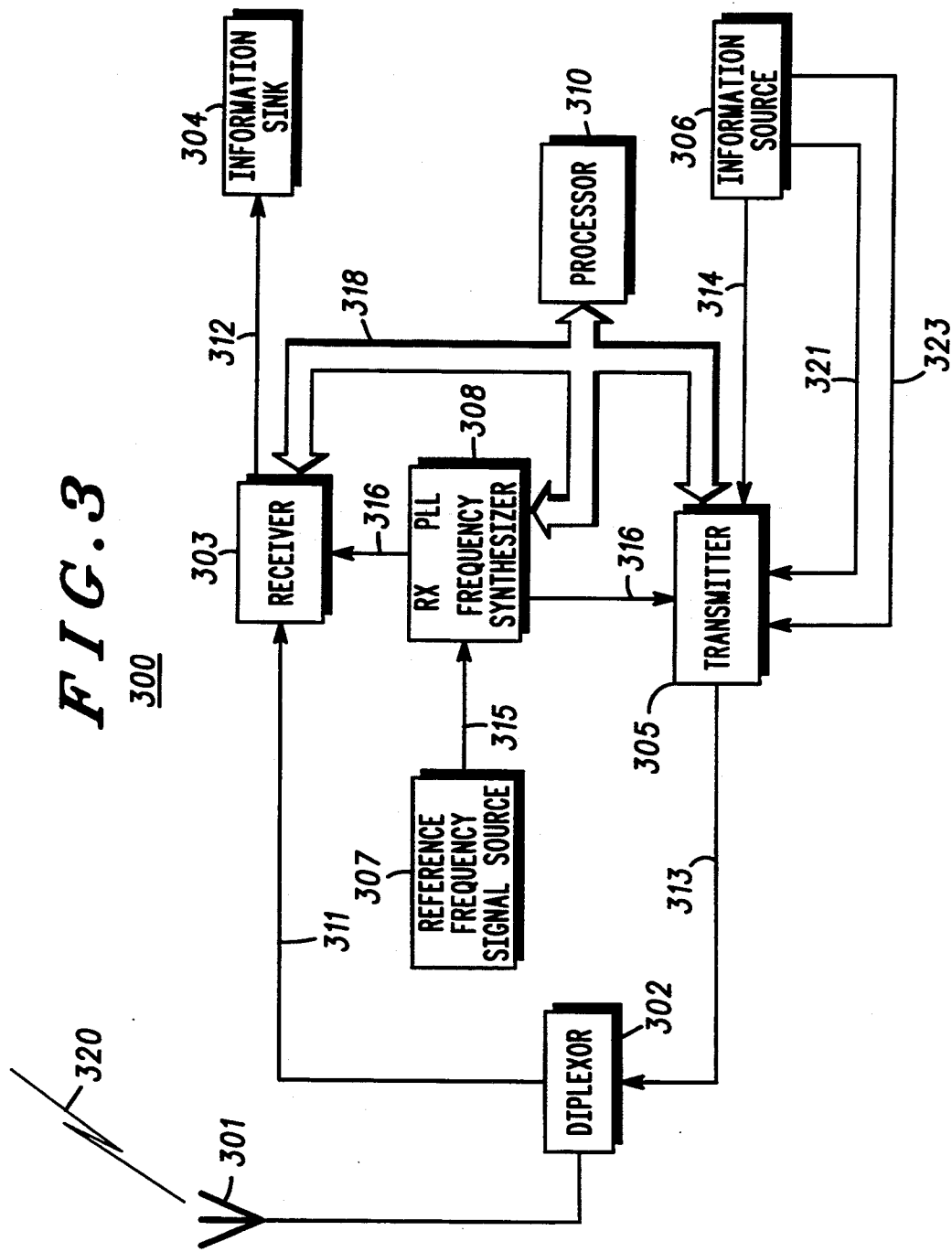
FIG. 3 is an illustration in block diagram form of a radiotelephone system in accordance with the present invention.

FIG. 3 illustrates, by example, a block diagram of a conventional radio communication transceiver 300 (hereinafter referred to as "transceiver"). The transceiver 300 enables a mobile or portable subscriber unit to communicate with a base station (not shown), for example, over radio frequency (RF) channels in a radio communication system (not shown). The base station thereafter provides communications with a land-line telephone system (not shown) and other subscriber units. An example of a subscriber unit having the transceiver 300 is a cellular radiotelephone.

The transceiver 300 of FIG. 3 generally includes an antenna 301, a diplexor 302, a receiver 303, a transmitter 305, a reference frequency signal source 307, a phase locked loop (PLL) frequency synthesizer 308, a processor 310, an information source 306, and an information sink 304.

The interconnection of the blocks of the transceiver 300 and operation thereof is described as follows. The antenna 301 receives an RF signal 320 from the base station for filtering by the diplexor 302. The diplexor 302 provides frequency selectivity to separate the RF received signal at line 311 and the RF transmit signal at line 313. Alternatively, the diplexor may provide temporal selectivity to separate the RF received signal at line 311 and the RF transmit signal at line 313 by means of a switch. The receiver 303 is coupled to receive the RF received signal at line 311 and operative to produce a received baseband signal at line 312 for the information sink 304. The reference frequency signal source 307 provides a reference frequency signal at line 315. The PLL frequency synthesizer 308 is coupled to receive the reference frequency signal at line 315 and information on a data bus 318 and operative to produce a transceiver tuning signal at line 316 to tune the receiver 303 and transmitter 305 to a particular RF channel. The processor 310 controls the operation of the PLL frequency synthesizer 308, the receiver 303, and the transmitter 305 via the data bus 318. The information source 306 produces a baseband amplitude modulation signal at line 314, and baseband phase modulation signal at line 321. The transmitter 305 is coupled to receive the baseband amplitude signal 314, the baseband phase modulation signal 321 operative to produce the RF transmit signal at line 313. The diplexor 302 couples RF transmit signal at line 313 for radiation by the antenna 301 as an RF signal 320.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the land-line telephone system. In cellular radiotelephone systems capable of transceiving wideband data on the signaling channels, the frequency spacing of the signaling channels may be a multiple of the frequency spacing of the voice channels.

In some cellular radiotelephone systems, the transceiver 300 and the base station intermittently transceive information therebetween on the signaling channel. One such system, for example, uses a time division multiple access (TDMA) signaling method to synchronize the intermittent information. In this type of system, keeping the transceiver 300 fully powered during the entire time that the transceiver 300 is tuned to the signaling channel unnecessarily drains the transceiver's battery during those times when the information is not received. Therefore, portions of the transceiver 300 can be powered off to prolong battery life when the transceiver is not transceiving information. Further, portions of the transceiver 300 can be powered off to prolong battery life when the signal quality is good enough such that further repetition of the same information is not needed. Intermittently powering on and off, i.e. enabling and disabling, the transceiver 300 during its receive operation is called discontinuous receive (DRX) mode of operation. In the DRX mode of operation, quickly enabling and disabling the portions of the transceiver 300 produces the greatest savings in battery life.

Figure 4:
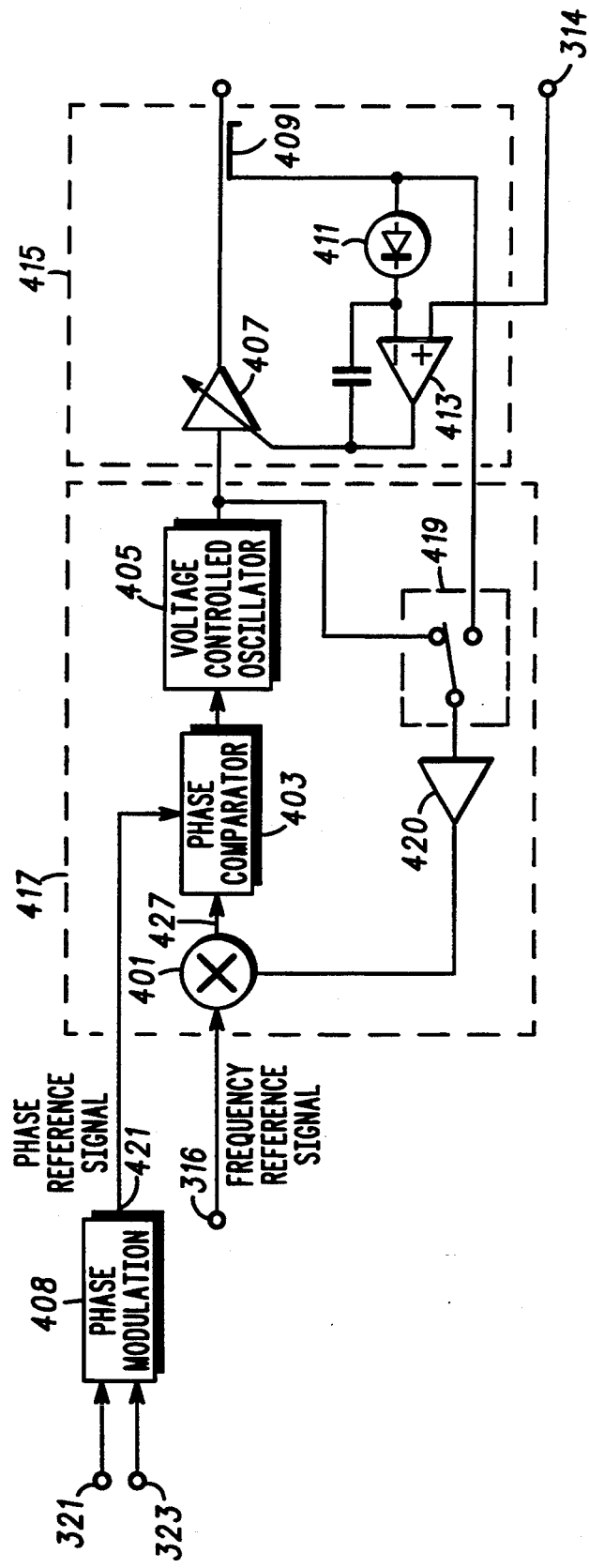
FIG. 4 is a detailed illustration in block diagram form of a transmitter in accordance with the present invention.

FIG. 4 is an illustration in block diagram form of the transmitter 305 of FIG. 3. In the embodiment illustrated in FIG. 3, the phase modulation signal 321 provides a baseband inphase (I) modulation signal and quadrature (Q) modulation signal. The phase modulator 408 operates on the baseband I phase modulation signal and the baseband Q phase modulation signal to generate a modulated carrier signal 421 which acts as the phase reference signal input to the PM loop 417. The PM loop 417 consists of a mixer 401, a phase detector 403, a voltage controlled oscillator (VCO) 405, a PA 407, a coupler 409, a switch 419, and a limiter 420. When the PA 407 is initially turned on, the switch 4 19 connects the VCO 405 output signal to the limiter 420. After the AM control loop 4 15 attains a locked condition, the switch 419 connects the coupler output signal to the limiter 420. The switching provides a signal to the mixer 40 1 that has a sufficient power level for the PM control loop 417 to attain lock whether the PA 407 is on or off. Alternatively, the switch 419 and limiter 420 could be eliminated if PA output signal is sufficient for the PM control loop 417 to attain lock while the PA 407 is off, or if the PA 407 is never turned off.

The mixer 401 generates an intermediate frequency signal 427 having a frequency which is equal to the difference of the frequency of the frequency reference input signal 316 and the frequency of the signal which is fed back from the limiter 420. The phase comparator 403 generates an error signal based on the difference in phase of the intermediate frequency signal 427 and the phase reference input signal 421. The phase comparator output drives the a tuning port of the VCO 405 such that the limiter 420 output signal has a phase which is approximately equal to the phase of the phase reference input signal 421. Since the limiter 420, the switch 419, and the coupler 409 have low phase distortion, the PA output has a phase which is also approximately equal to the phase of the phase reference input signal 421. The PM control loop 417 thereby achieves phase modulation of the PA 407 output signal.

Additionally, the PM control loop 4 17 achieves the necessary predistortion at the VCO output signal such that the phase distortion in the PA is automatically canceled. The predistortion is achieved without the complexity of a dedicated predistortion loop circuit. The predistortion is accomplished by tuning the VCO 405 instead of a phase shifter as discussed in the background of the invention. By using the VCO 405 the amount of PA phase correction is essentially unlimited. Therefore the problem of exceeding the range of possible phase shifts is eliminated.

The phase comparator output also drives the VCO tuning port such that the VCO output signal has a frequency which is equal to the frequency of the frequency reference signal 316 plus or minus the frequency of the phase reference signal 421. The PM loop 417 thereby achieves frequency translation. The AM control loop 415 is integrated about the PA 407. The AM control loop 415 includes the PA 407, the output power coupler 409, an envelope detector 411 and a difference amplifier 413. A portion of the PA output signal is fed back to the envelope detector 411 via the coupler 409. The difference amplifier 413 generates an error signal based on the difference in voltage of the envelope detector output and the amplitude reference input signal 314 which comes from the information source 306. Alternatively, the amplitude reference signal 314 could be derived from the amplitude of the phase modulator output signal 421. The difference amplifier 413 drives the PA output amplitude control port such that the amplitude of the PA output is responsive to the voltage of the amplitude reference input signal 314, thereby achieving amplitude modulation of the power amplifier output signal.

FIG. 5 is an illustration in block diagram form of the transmitter 305 of FIG. 3. The PM loop 517 consists of a phase detector 503, a low pass filter 502, a voltage controlled oscillator (VCO) 505, a PA 507, a coupler 509, a switch 519, a limiter 520, and a fractional N divider 501. The fractional N divider 501 includes a multi-accumulator fractional N phase locked loop such as that shown in U.S. Pat. No. 5,166,642 entitled "Multiple Accumulator Fractional N Synthesis with Series Recombination" by Hietala and assigned to the assignee of the present invention. When the PA 507 is initially turned on, the switch 519 connects the VCO 505 output signal to the limiter 520. After the PM control loop 517 attains a locked condition, the switch connects the coupler 509 output signal to the limiter 520. The switch 519 and limiter 520 thereby provide a signal to the fractional N divider 501 that has a sufficient power level for the loop to attain lock when the PA 507 is in the off condition. Alternatively, the switch 519 and the limiter 520 could be eliminated if the PA output signal level in the off condition is sufficient for the loop to attain lock. The phase comparator generates an error signal based on the difference in phase of the fractional N divider output signal 527 and the reference input signal 521. The phase comparator output drives the VCO tuning port such that the limiter 520 output signal has a phase which is approximately equal to the phase of the reference input signal multiplied by the fractional N division ratio. Since the limiter 520, switch 519, and coupler 509 have low phase distortion, the PA output has a phase which is also approximately equal to the phase of the reference input signal 521 multiplied by a fractional N division ratio provided on the phase modulation signal 321. The PM loop 517 thereby achieves phase modulation of the VCO 505 output signal. Furthermore the PM loop achieves the necessary predistortion at the VCO output signal such that the phase distortion in the PA is automatically cancelled. The predistortion is achieved without the complexity of a dedicated predistortion loop circuit. Since the predistortion is accomplished by tuning a VCO instead of a phase shifter, the amount of PA phase correction is essentially unlimited. Therefore the problem of exceeding the range of possible phase shifts is eliminated. The phase comparator output also drives the VCO tuning port such that the VCO output signal has a frequency which is equal to the desired transmitter output frequency.

FIG. 6 is an illustration in block diagram form of an alternative transmitter in accordance with the present invention. Here, the phase information signal 321 provides a digital integer representing a desired frequency input into the divide by N 601 and an analog phase modulation signal input to the adder 604 of FIG. 6. Alternatively, the digital integer may provide a portion of the phase modulation. This transmitter illustrates an alternate method of applying phase modulation to the fractional N phase locked loop. Here, an analog modulation waveform is applied to the output of phase detector 603. Due to the wide bandwidth possible with the fractional N synthesizer, the analog signal on this port may contain significant spectral components as compared to a non-fractional phase locked loop. Operation of the transmitter is identical to that shown in FIG. 5 in all other respects. AM control loop 515 and AM control loop 615 are topologically and functionally similar to the AM control loop 415 of FIG. 4.

What is claimed is:

1. A transmitter for transmitting signals, the signals containing amplitude modulation (AM) and phase modulation (PM), the transmitter comprising:

a power amplifier (PA) having a signal input and an amplitude control input, the power amplifier generating an amplified PA output signal having a phase, a frequency and a variable amplitude, the amplitude responsive to the amplitude control input; and a PM control loop having a feedback signal input, a phase reference signal input, and a frequency reference signal input having a frequency, the PM control loop including inter alia a voltage controlled oscillator (VCO), the VCO having a VCO output signal and a control signal input, the VCO output signal is coupled to the signal input of the power amplifier, and the feedback signal input is coupled to the PA amplified output signal, the PM control loop providing a phase modulated and predistorted VCO output signal such that the phase of the PA output signal is responsive to the phase reference input signal, and the frequency of the PA output signal is responsive to the frequency of the frequency reference signal.

2. A transmitter in accordance with claim 1 wherein the PM control loop further comprises a mixer having a first and second input and an output, and a phase comparator having a first and second input and an output, the first mixer input coupled to the PA output signal, the second mixer input coupled to the frequency reference signal, the mixer output responsive to the frequency of the frequency reference signal and coupled to the first input of the phase comparator, the second input of the phase comparator coupled to the phase reference signal, the phase comparator output responsive to a phase of the phase reference signal and coupled to the VCO control signal input.

3. A transmitter in accordance with claim 1 wherein the power amplifier is a non-linear power amplifier.

4. A transmitter in accordance with claim 1 wherein the amplitude control input is provided from an AM controller, the AM controller having a signal input and an amplitude reference input, the AM controller signal input coupled from the amplified output signal, the AM controller providing a control signal output coupled to the control input of the power amplifier such that the variable amplitude output of the power amplifier is responsive to the amplitude reference input.

5. A transmitter in accordance with claim 1 wherein the PA amplified output signal is switchably coupled to the feedback signal input of the PM control loop.

6. A radio for transmitting radio frequency (RF) signals on a selected channel, the radio comprising:
 a controller for generating an amplitude reference signal, a RF carrier signal, and a phase information signal, the radio frequency carrier signal having a first frequency and a first phase;
 a transmitter comprising:
  a modulator having an input coupled to the phase information signal and generating a phase modulated (PM) carrier signal having a second phase;
  a power amplifier (PA) having a data signal input and a PA control input and an output, the output providing an amplified and modulated PA output signal having a third frequency and a third phase, the third frequency and the third phase responsive to the data signal input;
  an amplitude modulation (AM) controller having a first input and a second input, the first input coupled to the amplitude reference signal, the second input coupled to the output of the PA, the AM controller generating an amplitude control signal coupled to the PA control input, the amplitude control signal determining the amplitude of the PA output signal and responsive to the amplitude reference signal;
  a mixer having a first input and a second input, the first input coupled to the radio frequency carrier signal, the second input coupled to the power amplifier output signal, the mixer providing an output signal having a fourth frequency equal to the difference between the first frequency and the third frequency and a fourth phase equal to the difference between the first phase and the third phase;
  a phase detector having a first input and a second input, the first input coupled to the mixer output signal, the second input coupled to the PM carrier signal, the phase detector providing a phase detector output signal responsive to the difference between the second phase and the fourth phase; and
  an oscillator having an input, the input coupled to the phase detector output signal, the oscillator output coupled to the data signal input to the power amplifier, the data signal having a phase determined by the phase detector output signal and responsive to the phase modulated (PM) carrier signal and having a frequency determined by the phase detector output signal and responsive to the radio frequency carrier signal.

7. A radio in accordance with claim 6 wherein the amplitude reference signal is a portion of a modulation signal, the modulation signal having an amplitude and a phase component.

8. A radio in accordance with claim 6 wherein a frequency of the RF carrier signal determines a frequency of the selected channel.

9. A radio in accordance with claim 6 wherein the phase detector output signal provides a voltage responsive to the difference between the second and the fourth phase.

10. A radio in accordance with claim 9 wherein the oscillator is a voltage controlled oscillator.

11. A transmitter for transmitting signals, the signals containing amplitude modulation (AM) and phase modulation (PM), the transmitter comprising:
 a power amplifier having a signal input and an amplitude control input, the power amplifier generating an amplified PA output signal having a variable amplitude responsive to the amplitude control input and having a phase and a frequency; and
 a PM control loop having a phase modulated output, a feedback signal input, a modulation reference signal input having information content, and a frequency reference signal input having a frequency, the PM control loop comprised of a voltage controlled oscillator (VCO) having a VCO output signal and a control signal, the VCO output signal coupled to the signal input of the power amplifier, the feedback signal input coupled to the PA output signal, the PM control loop providing a phase modulated and predistorted VCO output signal such that the phase of the PA output signal is responsive to the information content of the modulation reference signal, and the frequency of the PA output signal is responsive to the frequency of the frequency reference signal.

12. A transmitter in accordance with claim 11 wherein the PM control loop further comprises a frequency divider having a first and a second input and an output, and a phase comparator having a first and second input and an output, the first input of the frequency divider coupled to the PA output signal, and the second input of the frequency divider coupled to the modulation reference signal, the frequency divider output coupled to the first input of the phase comparator, the second input of the phase comparator coupled to the frequency reference signal, the phase comparator output responsive to the information content of the modulation reference signal and coupled to the VCO as the control signal.

13. A transmitter in accordance with claim 12 wherein the frequency divider is composed of a fractional N type of frequency divider.

14. A transmitter in accordance with claim 12 wherein the information content of the modulation reference signal is a digital signal.

15. A transmitter in accordance with claim 11 wherein the PM control loop further comprises a frequency divider having a first and a second input and an output, a phase comparator having a first and second input and an output, and an analog adder having a first and a second input and an output, the first input of the divider coupled to the PA output signal, and the second input of the divider coupled to a digital number representing the frequency of the output, the divider output coupled to the first input of the phase comparator, the second input of the phase comparator coupled to the frequency reference signal, the phase detector output coupled to the first input of the analog adder, the second input of the analog adder coupled to the modulation reference signal and the output of the analog adder coupled to the VCO as the control signal.

16. A transmitter in accordance with claim 15 wherein the frequency divider is composed of a fractional N type of frequency divider.

17. A transmitter in accordance with claim 15 wherein the modulation reference signal is an analog signal.

18. A transmitter in accordance with claim 11 wherein the power amplifier is a non-linear power amplifier.

19. A transmitter in accordance with claim 11 wherein the amplifier control input is provided from an AM controller having a signal input and an amplitude reference input, the signal input coupled from the amplified output signal, the AM controller providing a control signal output coupled to the control input of the power amplifier such that the variable amplitude output of the power amplifier is responsive to the amplitude reference input.

20. A radio for transmitting RF signals on a selected channel the radio comprising:
   a controller for generating an amplitude reference signal, a reference frequency signal and a baseband phase modulated (PM) signal, the baseband PM signal having a first integer value, the reference frequency signal having a first frequency and a first phase;
   a transmitter comprising:
      a power amplifier having a data signal input and a control input and an output, the output providing an amplified and modulated output signal having a second frequency and a second phase, the second frequency and second phase responsive to the data signal input;
      an amplitude modulation (AM) controller having a first input and a second input, the first input coupled to the amplitude reference signal, the second input coupled to the output of the power amplifier, the AM controller generating an amplitude control signal coupled to the control input of the power amplifier, the amplitude control signal determining the amplitude of the power amplifier output signal and responsive to the amplitude reference signal;
      a frequency divider having a first input and a second input, the first input coupled to the baseband PM signal, the second input coupled to the power amplifier output signal, the frequency divider providing an output signal having a third frequency equal to a ratio of the second frequency and the integer value and a third phase equal to a ratio of the second phase and the integer value;
      a phase detector having a first input and a second input, the first input coupled to the frequency divider output signal, the second input coupled to the reference frequency signal, the phase detector providing an output signal responsive to the difference between the third phase and the first phase; and
      an oscillator having an input, the input coupled to the phase detector output signal, the oscillator generating the data signal input to the power amplifier, the data signal having a frequency and phase determined by the phase detector output signal and responsive to the baseband PM signal.

21. A radio in accordance with claim 20 wherein the amplitude reference signal is a portion of a modulation signal, the modulation signal having an amplitude and a phase component.

22. A radio in accordance with claim 20 wherein the oscillator is a voltage controlled oscillator.

23. A radio in accordance with claim 20 wherein the frequency divider is composed of a fractional N type of frequency divider.

24. A radio in accordance with claim 20 wherein the power amplifier is a non-linear power amplifier.

* * * * *